US012796168B2

(12) United States Patent
Yajima et al.

(10) Patent No.: US 12,796,168 B2
(45) Date of Patent: Nov. 10, 2026

(54) LIGHT EMITTING ELEMENT BONDED TO A LIGHT TRASMITTING PLATE AND MANUFACTURING METHOD

(71) Applicant: STANLEY ELECTRIC CO., LTD., Tokyo (JP)

(72) Inventors: Takuma Yajima, Tokyo (JP); Yusaku Fujii, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 338 days.

(21) Appl. No.: 18/637,314

(22) Filed: Apr. 16, 2024

(65) Prior Publication Data

US 2024/0355955 A1 Oct. 24, 2024

(30) Foreign Application Priority Data

Apr. 24, 2023 (JP) ................................ 2023-070619

(51) Int. Cl.

*H10H 20/81* (2025.01)
*H10H 20/01* (2025.01)
*H10H 20/813* (2025.01)
*H10H 20/854* (2025.01)

(52) U.S. Cl.

CPC ........ *H10H 20/81* (2025.01); *H10H 20/0133* (2025.01); *H10H 20/8131* (2025.01); *H10H 20/854* (2025.01); *H10H 20/0362* (2025.01)

(58) Field of Classification Search

CPC .. H10H 20/01; H10H 20/0133; H10H 20/014; H10H 20/0145; H10H 20/018; H10H 20/019; H10H 20/0362; H10H 20/80; H10H 20/81; H10H 20/813; H10H 20/8131; H10H 20/817; H10H 20/822; H10H 20/854; H10H 29/0362; H10H 29/80; H10H 29/854

See application file for complete search history.

(56) References Cited

U.S. PATENT DOCUMENTS

2010/0032650 A1* 2/2010 Nam ................ H10H 20/01335
257/E33.049

FOREIGN PATENT DOCUMENTS

| | | | |
|---|---|---|---|
| JP | 2017126720 | A | 7/2017 |
| JP | 6729275 | B2 | 7/2020 |

* cited by examiner

*Primary Examiner* — Cheung Lee

(74) *Attorney, Agent, or Firm* — Holtz, Holtz & Volek PC

(57) ABSTRACT

A light emitting element includes an element main body and a sapphire substrate. The element main body has an AlGaAs-based semiconductor layer, an n-type current diffusion layer, and a cap layer of an InGa-based semiconductor that does not contains As as a component in a lamination direction. The amorphous layer is interposed between the element main body and the sapphire substrate, and contains constituent elements of the cap layer and the sapphire substrate as components.

12 Claims, 7 Drawing Sheets

LIGHT EMITTING ELEMENT BONDED TO A LIGHT TRASMITTING PLATE AND MANUFACTURING METHOD

BACKGROUND OF THE INVENTION

Field of the Invention

The present invention relates to a light emitting element including a sapphire substrate and a manufacturing method thereof.

Description of the Related Art

An infrared light emitting element is produced by bonding an element main body including an AlGaAs-based semiconductor layer as a light emitting portion and a sapphire substrate as a light transmitting plate (for example, Patent Literatures 1 and 2).

In the light emitting element of Patent Literature 1, InGaP/AlInGaP is formed on a bonding side of an element main body by epitaxial growth, and then the element main body and a sapphire substrate are bonded to each other with an adhesive.

In the light emitting element of Patent Literature 2, InGaP/AlInGaP is formed on a bonding side of an element main body by epitaxial growth, and then $SiO_2$ films are formed on each bonding surface between an epitaxial growth layer and a sapphire substrate, and the two $SiO_2$ films are bonded to each other without using an adhesive.

CITATION LIST

Patent Literatures

Patent Literature 1: Japanese Patent No. 6729275

Patent Literature 2: Japanese Patent Application Laid-Open No. 2017-126720

SUMMARY OF THE INVENTION

In bonding between the element main body and the sapphire substrate in the light emitting element of Patent Literature 1, an adhesive layer is interposed, so that an adhesive force of the adhesive layer is weakened at a temperature (for example, 300° C. or higher) during an annealing treatment.

In bonding between the element main body and the sapphire substrate in the light emitting element of Patent Literature 2, an $SiO_2$ film is bonded as a bonding interface, but a refractive index (about 1.4) of $SiO_2$ for light with a wavelength of 940 nm is smaller than a refractive index (about 1.7) of sapphire. As a result, a difference in refractive index of the interface between the epitaxial layer and $SiO_2$ on the element main body side is larger than a difference in refractive index of the interface between the epitaxial layer and the sapphire substrate, and a total reflection component on the element main body side is increased, thereby leading to a decrease in light extraction efficiency from the element main body.

An object of the present invention is to provide a light emitting element that is able to bond an element main body and a sapphire substrate without using an adhesive or $SiO_2$, and is able to strengthen bonding of a bonding portion, and a manufacturing method thereof.

The present invention is based on the following findings. (a) When an element main body and a sapphire substrate are bonded to each other without an adhesive and then subjected to an annealing treatment at 300° C. or higher, As (arsenic) is precipitated in fine voids at a bonding interface of an AlGaAs layer of the element main body on a bonding side, and the voids are expanded, which leads to a decrease in a bonding force. (b) When the AlGaAs layer is coated on a layer of an InGa-based semiconductor not containing As as a component and then is bonded thereto, an amorphous layer formed between the coating film and the sapphire substrate eliminates precipitation of As in the voids during annealing treatment.

A light emitting element according to an aspect of the present invention includes an AlGaAs-based semiconductor layer in which an active layer is disposed between a first semiconductor layer and a second semiconductor layer, and emits light from a second semiconductor layer side; a cap layer of an InGa-based semiconductor, which is formed on a light emission side of the second semiconductor layer and contains no As as a component; a sapphire substrate that is disposed on a light emission side of the cap layer; and an amorphous layer that is interposed between the cap layer and the sapphire substrate, and has constituent elements of the cap layer and the sapphire substrate as components.

A manufacturing method of a light emitting element according to another aspect of the present invention includes a step of forming at least a first semiconductor layer, an active layer, and a second semiconductor layer in this order on a GaAs substrate by epitaxial growth to produce an AlGaAs-based semiconductor layer; a step of forming a cap layer of an InGa-based semiconductor, which contains no As as a component, on a light emission side of the AlGaAs-based semiconductor layer on a second semiconductor layer side by epitaxial growth; a step of performing a plasma activation treatment on a bonding surface of the cap layer and a sapphire substrate before the cap layer and the sapphire substrate are bonded to each other; and a step of bonding the bonding surfaces of the cap layer and the sapphire substrate to each other to form an amorphous layer having constituent elements of the cap layer and the sapphire substrate as components between the bonding surfaces.

According to the present invention, the cap layer of the InGa-based semiconductor, which contains no As as a component, is provided on the bonding surface on the element main body side with respect to the bonding surface on the sapphire substrate side, and the amorphous layer, which contains no As as a component and contains constituent elements of the cap layer and the sapphire substrate as components, is formed between the cap layer and the sapphire substrate in association with the bonding. As a result, the precipitation of As at the bonding portion is suppressed, and a decrease in the bonding force between the element main body and the sapphire substrate can be prevented.

DESCRIPTION OF THE PREFERRED EMBODIMENTS

Figure 1:
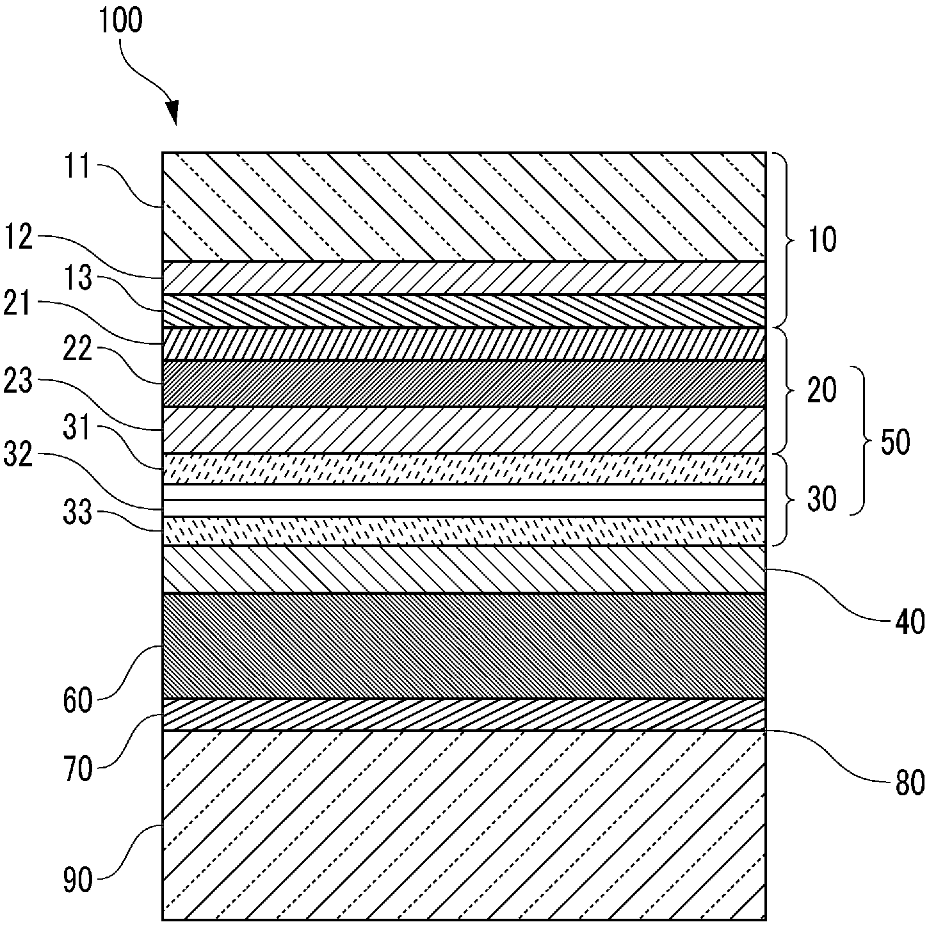
FIG. 1 is a sectional view of a laminated structure during a maximum lamination that is generated in manufacturing of an infrared light emitting element.

Hereinafter, preferred embodiments of the present invention will be described, but these may be appropriately modified and combined. In the following description and the accompanying drawings, substantially the same or equivalent parts will be described with the same reference numerals.

[Entire Laminated Structure]

Figure 2:
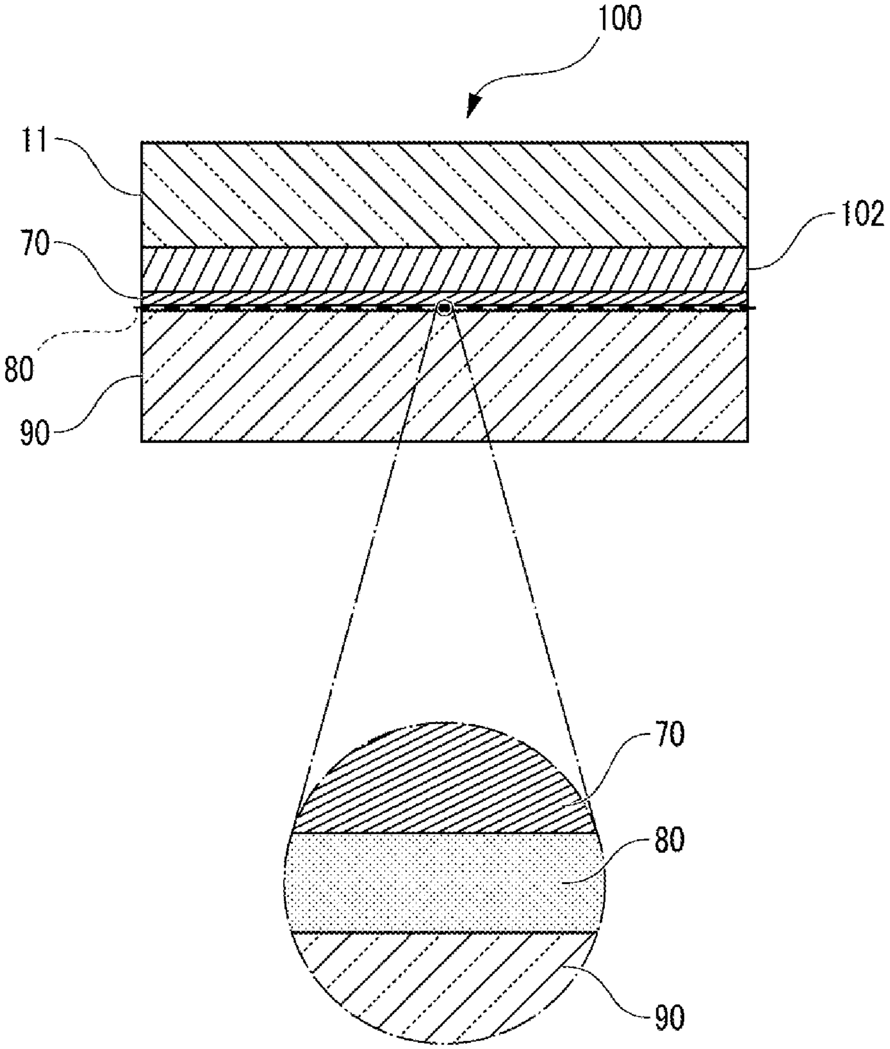
FIG. 2 is a sectional view schematically illustrating a feature of a main portion of the laminated structure of FIG. 1.
Figure 8:
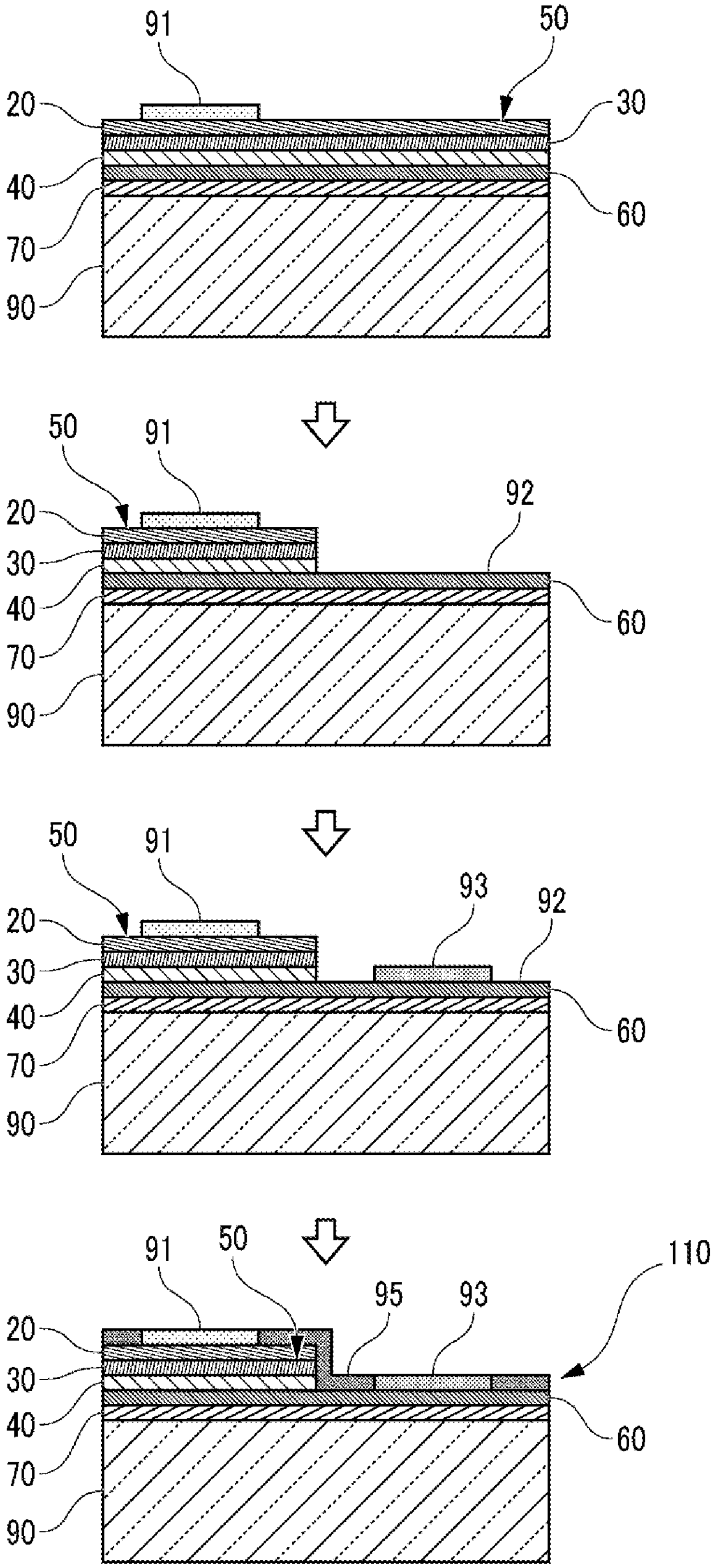
FIG. 8 is a manufacturing process diagram of an infrared light emitting element following the step of FIG. 7.

FIG. 1 is a sectional view of a laminated structure 100 during a maximum lamination that is generated in manufacturing of an infrared light emitting element 110 (FIG. 8). FIG. 2 is a sectional view schematically illustrating a feature of a main portion of the laminated structure 100. In the manufacturing of the infrared light emitting element 110, layers are sequentially laminated to generate the laminated structure 100, and then deletion by etching is sequentially performed. Therefore, the laminated structure 100 is a laminated structure during the maximum lamination generated in a manufacturing process of the infrared light emitting element 110, and has all the layers involved in the manufacturing of the infrared light emitting element 110.

Names of elements represented by respective element symbols used in the specification are as follows. In: indium, Ga: gallium, As: arsenic, P: phosphorus, Al: aluminum, O: oxygen, Au: gold, and Si: silicon, N: nitrogen. Substance names represented by respective chemical formula are as follows. $Al_2O_3$: alumina, $O_2$: oxygen, and $SiO_2$: silicon dioxide. Meanings of respective abbreviations are as follows. CSL: current spreading layer, and MQW: multiple quantum well.

In the lamination on an element main body side in the laminated structure 100, all the layers from an i-type GaAs buffer 12 to a cap layer 70 in the order from an upper side to a lower side in FIG. 1 (hereinafter, referred to as "lamination direction") are formed on a surface of the substrate main body 11 composed of Ga and As as components by epitaxial growth. The epitaxial growth is performed by, for example, an MOCVD method. After the lamination is completed, next, the element main body and a sapphire substrate 90 are bonded to each other with surface orientations thereof aligned with a c-plane (001) of the sapphire substrate 90. It is not necessary to strictly align with the c-plane (001). The alignment with the c-plane (001) within a predetermined off-angle range without impairing the bonding is within a range of design matters of those skilled in the art, and is included in the concept of "aligned with the c-plane (001)" here.

An amorphous layer 80 is generated as a component of constituent elements (In, Ga, and P) of the cap layer 70 and constituent elements (Al and O) of the sapphire substrate 90 in association with the bonding between the cap layer 70 and the sapphire substrate 90. As will be described later with reference to FIG. 6, the bonding is performed by heating the element main body and the amorphous layer 80 while pressurizing both sides thereof in the lamination direction, or by performing a plasma activation treatment on the bonding surface before the bonding.

The laminated structure 100 includes a GaAs substrate 10, a p-type semiconductor 20, an active layer 30, an n-type semiconductor layer 40, an n-type current diffusion layer 60, the cap layer 70, the amorphous layer 80, and the sapphire substrate 90 in this order in the lamination direction in FIG. 1. The GaAs substrate 10 is used for forming the p-type semiconductor 20, the active layer 30, the n-type semiconductor layer 40, the n-type current diffusion layer 60, and the cap layer 70 by epitaxial growth, and is removed after the bonding. Therefore, the GaAs substrate 10 is not included as a component of the infrared light emitting element 110 as a final product.

The GaAs substrate 10 has the substrate main body 11, the i-type GaAs buffer 12, and an InGaP etch stop 13 in this order in the lamination direction. In FIG. 2, an epitaxial growth layer 102 means the entire lamination from the i-type GaAs buffer 12 to the n-type current diffusion layer 60 of FIG. 1. The cap layer 70 is formed on the surface of the epitaxial growth layer 102 by epitaxial growth.

In the laminated structure before bonding, there is no amorphous layer 80 which is generated as a component of the constituent elements of the cap layer 70 and the sapphire substrate 90.

An AlGaAs-based semiconductor layer 50 is composed of the p-type semiconductor 20 as a first semiconductor, the active layer 30, and the n-type semiconductor layer 40 as a second semiconductor in this order in the lamination direction. The p-type semiconductor 20 has a p-type AlGaAs contact 21, a p-type AlGaAs current diffusion layer 22, and a p-type AlGaAs clad layer 23 in this order in the lamination direction. The active layer 30 has an i-type AlGaAs layer 31, an InGaAs/GaAsP_MQW layer 32, and an i-type AlGaAs layer 33 in this order in the lamination direction. The n-type semiconductor layer 40 is composed of a single n-type AlGaAs clad layer. The n-type current diffusion layer 60 and the cap layer 70 consist of AlGaAs.

An example of a thickness of each layer is as follows. i-type GaAs buffer 12: 400 nm, InGaP etch stop 13: 50 nm, p-type AlGaAs contact 21: 30 nm, p-type AlGaAs current diffusion layer 22: 600 nm, p-type AlGaAs clad layer 23: 500 nm, i-type AlGaAs layer 31: 500 nm, InGaAs/GaAsP_MQW layer 32: 130 nm, i-type AlGaAs layer 33: 500 nm, n-type semiconductor layer 40: 500 nm, n-type current diffusion layer 60: 5000 nm, cap layer 70: 90 nm, and amorphous layer 80: 15 nm.

[Cap Layer]

The cap layer 70 of InGaP of the embodiment uses a composition of In0.5-Ga0.5-P1.0. If the film thickness of the cap layer 70 is thin, Inx-Ga (1-x) P may be in a range of $0<x<1$, but from the viewpoint of a critical film thickness, it is preferable that the range of the In composition x is adjusted to about $0.35 \le x \le 0.65$ because the film thickness of the cap layer 70 is sufficiently thickened more than the film thickness of the amorphous layer 80 to prevent the amorphization of the semiconductor layer grown on the cap layer 70.

[Amorphous Layer]

Figure 3:
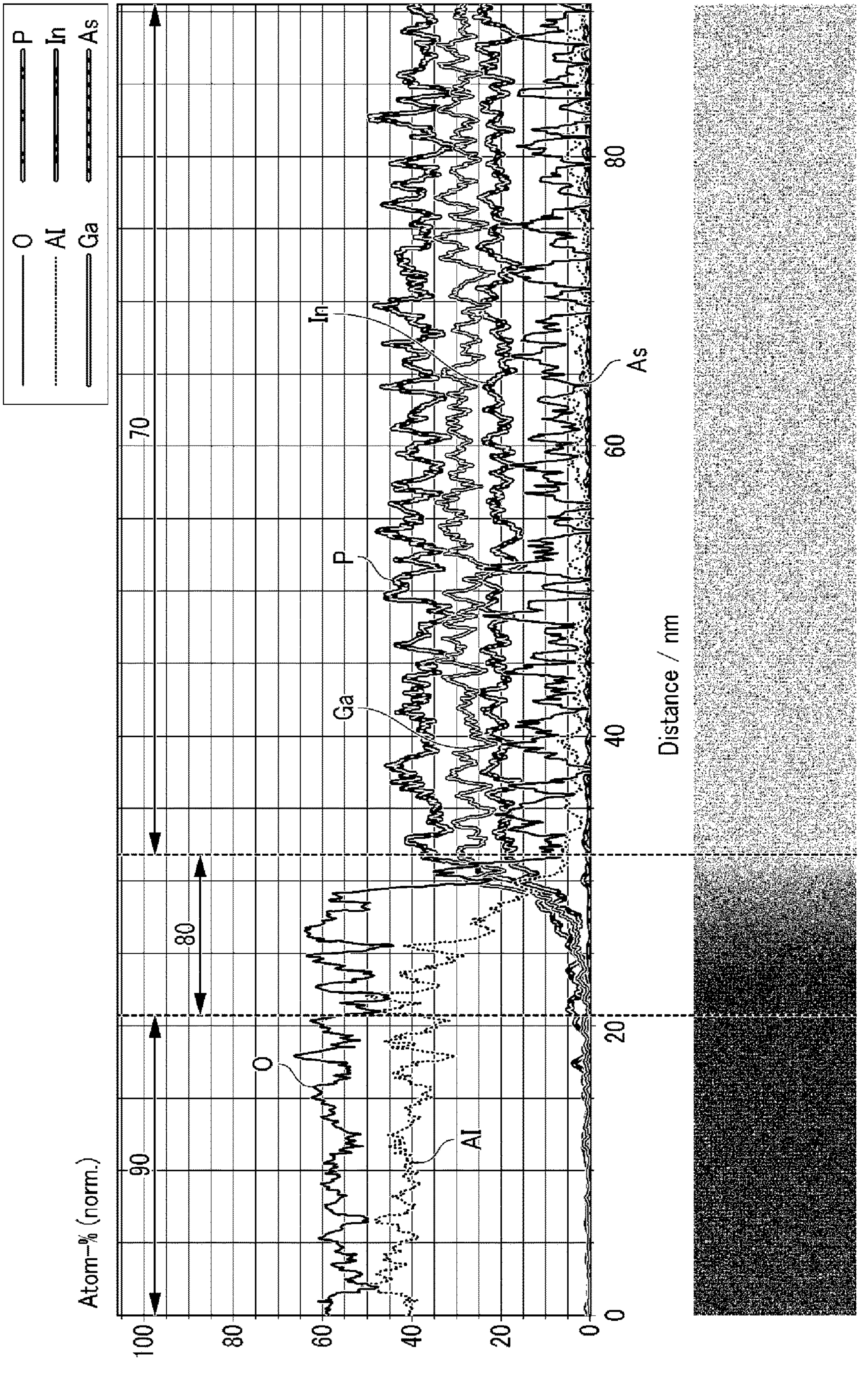
FIG. 3 is a diagram illustrating component analysis by TEM-EDS and a scattered electron image for a laminated range of adjacent portions of the amorphous layer and both sides thereof.

FIG. 3 is a diagram illustrating component analysis by a transmission electron microscope (TEM)-EDS and a scattered electron image (ZC) for a laminated range of adjacent portions of the amorphous layer 80 and both sides thereof. In the component analysis by the TEM-EDS, O and Al in the cap layer 70 of the InGaP are noise. That is, O and Al are not included as components in the cap layer 70.

In the scattered electron image (grayscale image) of FIG. 3, the heavier the atom, the lighter the image is, and the lighter the atom, the darker the image is. The thickness of the amorphous layer 80 is 15 nm. From the scattered electron image, it is found that the number of heavy atoms increases in the amorphous layer 80 as proceeding from a sapphire substrate 90 side to a cap layer 70 side.

The following is found from the component analysis of FIG. 3.

(a) The amorphous layer 80 contains In, Ga, and P as the constituent elements of the cap layer 70, and Al and O as the constituent elements of the sapphire substrate 90, as components.

(b) A ratio of O to Al (ratio in terms of atom-%) is larger in the amorphous layer 80 than in the sapphire substrate 90. Specifically, in the amorphous layer 80, the Atom-% of Al is clearly decreased as proceeding from the sapphire substrate 90 side to the cap layer 70 side, whereas in the amorphous layer 80, the Atom-% of $O_2$ is maintained at the same or a slow decrease as proceeding from the sapphire substrate 90 side to the cap layer 70 side, and then is sharply decreased after exceeding a center of the thickness of the amorphous layer 80.

(c) The amorphous layer 80 does not contain As and contains P.

(d) In the amorphous layer 80, InGaP from the cap layer 70 side and Al from the sapphire substrate 90 side are mixed while being changed in a graded manner. The mixing while being changed in the graded manner is evidence that the bonding actually occurs. When the gradual mixing is described in detail, in the amorphous layer 80, the Atom-% of In, Ga, and P as the constituent elements of the cap layer 70 decreases as it moves away from the cap layer 70 and approaches the sapphire substrate 90, and Al as the constituent element of the sapphire substrate 90 decreases as it moves away from the sapphire substrate 90 and approaches the cap layer 70.

Figure 4:
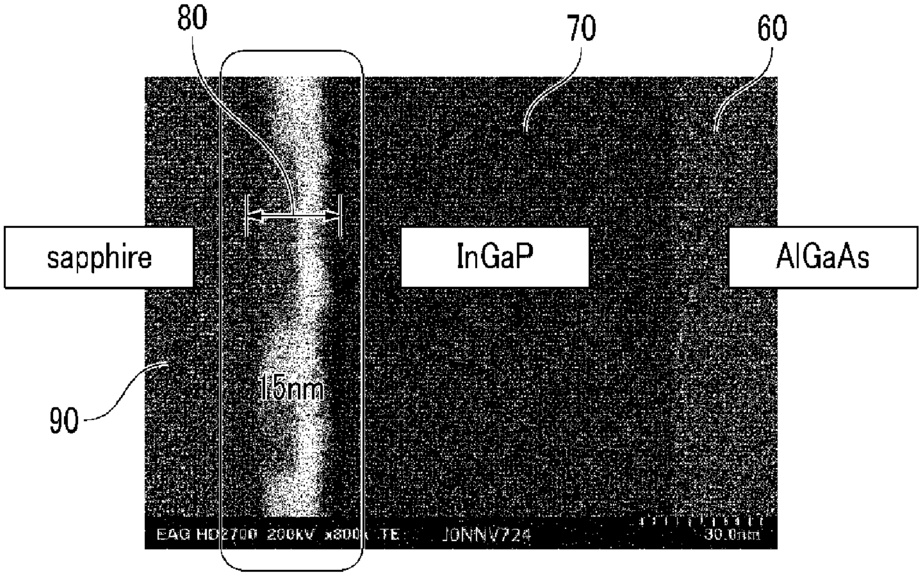
FIG. 4 is a diagram illustrating a transmission electron image by a TEM for a laminated range of adjacent portions of the amorphous layer and both sides thereof in a lamination direction.

FIG. 4 is a diagram illustrating a transmission electron image by a transmission electron microscope (TEM) for a laminated range of adjacent portions of the amorphous layer 80 and both sides thereof in the lamination direction. In the transmission electron image, the higher the density, the darker the image is displayed, and the lower the density, the lighter the image is displayed. The thickness of the amorphous layer 80 in FIG. 4 is 15 nm which is the same as the thickness of the amorphous layer 80 in FIG. 3.

The following is found from FIG. 4.

(a) The cap layer 70 consisting of InGaP has a higher density than the n-type current diffusion layer 60 consisting of AlGaAs and the sapphire substrate 90 consisting of $Al_2O_3$ on both sides in the lamination direction.

(b) The density of the amorphous layer 80 is lower than the densities of the n-type current diffusion layer 60, the cap layer 70, and the sapphire substrate 90.

Figure 5A:
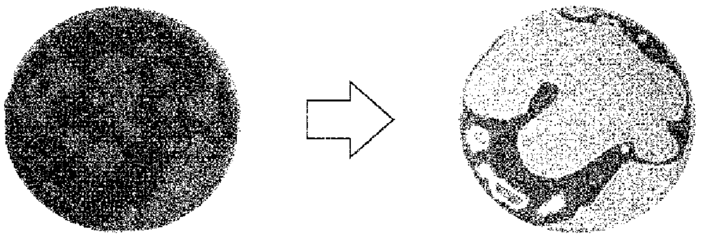
FIG. 5A is an external view of an epitaxial bonding interface of an epitaxial growth layer after bonding between the epitaxial growth layer and a sapphire substrate without forming a cap layer, before and after an annealing treatment thereof.
Figure 5B:
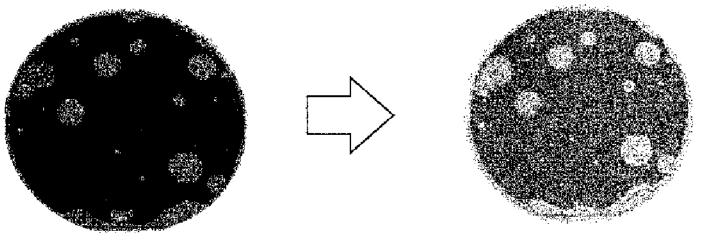
FIG. 5B is an external view of an epitaxial bonding interface of the cap layer after bonding between the cap layer and the sapphire substrate after forming the cap layer on a surface of the epitaxial growth layer, before and after the annealing treatment thereof.
Figure 5C:
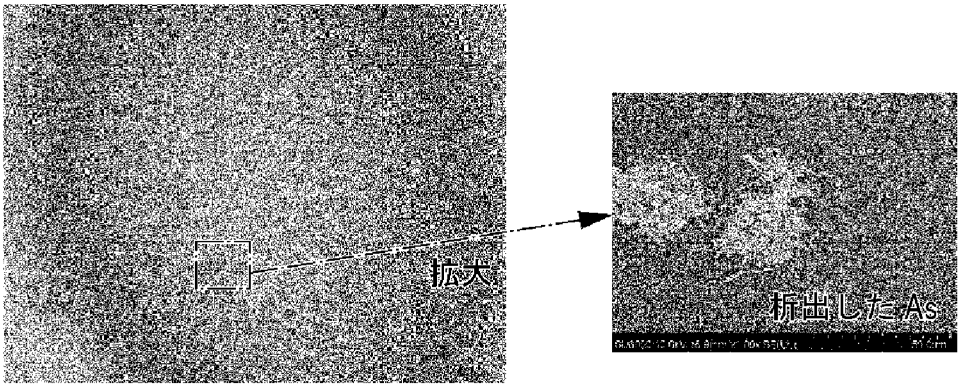
FIG. 5C is an image-captured view of voids at the epitaxial bonding interface of the epitaxial growth layer after the annealing treatment of FIG. 5A.

FIG. 5A is an external view of an epitaxial bonding interface (conventional epitaxial bonding interface) of the epitaxial growth layer 102 after bonding between the epitaxial growth layer 102 (FIG. 2) and the sapphire substrate 90 without forming the cap layer 70, before and after an annealing treatment thereof. FIG. 5B is an external view of an epitaxial bonding interface of the cap layer 70 (epitaxial bonding interface of an embodiment of the present invention) after bonding between the cap layer 70 and the sapphire substrate 90 after forming the cap layer 70 on the surface of the epitaxial growth layer 102, before and after the annealing treatment thereof. The annealing treatment is performed at 370° C. for 5 minutes in the related art and the embodiment. FIG. 5C is an image-captured view of voids at the epitaxial bonding interface of the epitaxial growth layer 102 after the annealing treatment of FIG. 5A.

From FIG. 5A, it is found that, when the epitaxial growth layer 102 and the sapphire substrate 90 are bonded to each other without using the adhesive and then subjected to the annealing treatment without forming the cap layer 70, the void is magnified. From FIG. 5C, it is found that As is precipitated in the magnified void. From these, it is found that when the precipitation of As at the bonding interface between the epitaxial growth layer 102 and the sapphire substrate 90 is prevented, the decrease in the bonding force due to the voids in the bonding portion is able to be prevented.

Then, based on this finding, when the cap layer 70 is formed on the surface of the epitaxial growth layer 102, and the cap layer 70 and the sapphire substrate 90 are bonded to each other, and then subjected to the annealing treatment, as illustrated in FIG. 5B, it is found that there is no magnification of voids due to the precipitation of As at the bonding interface of the cap layer 70. In this way, the bonding force is enhanced.

[Manufacturing Method]

A manufacturing method of the infrared light emitting element 110 will be described with reference to FIGS. 6 to 8. The element main body refers to a laminated portion from the substrate main body 11 to the cap layer 70 in the lamination direction before (before bonding) manufacturing of the laminated structure 100, and refers to a laminated portion from the p-type AlGaAs contact 21 to the cap layer 70 in the lamination direction after removing the GaAs substrate 10 from the laminated structure 100.

Figure 6:
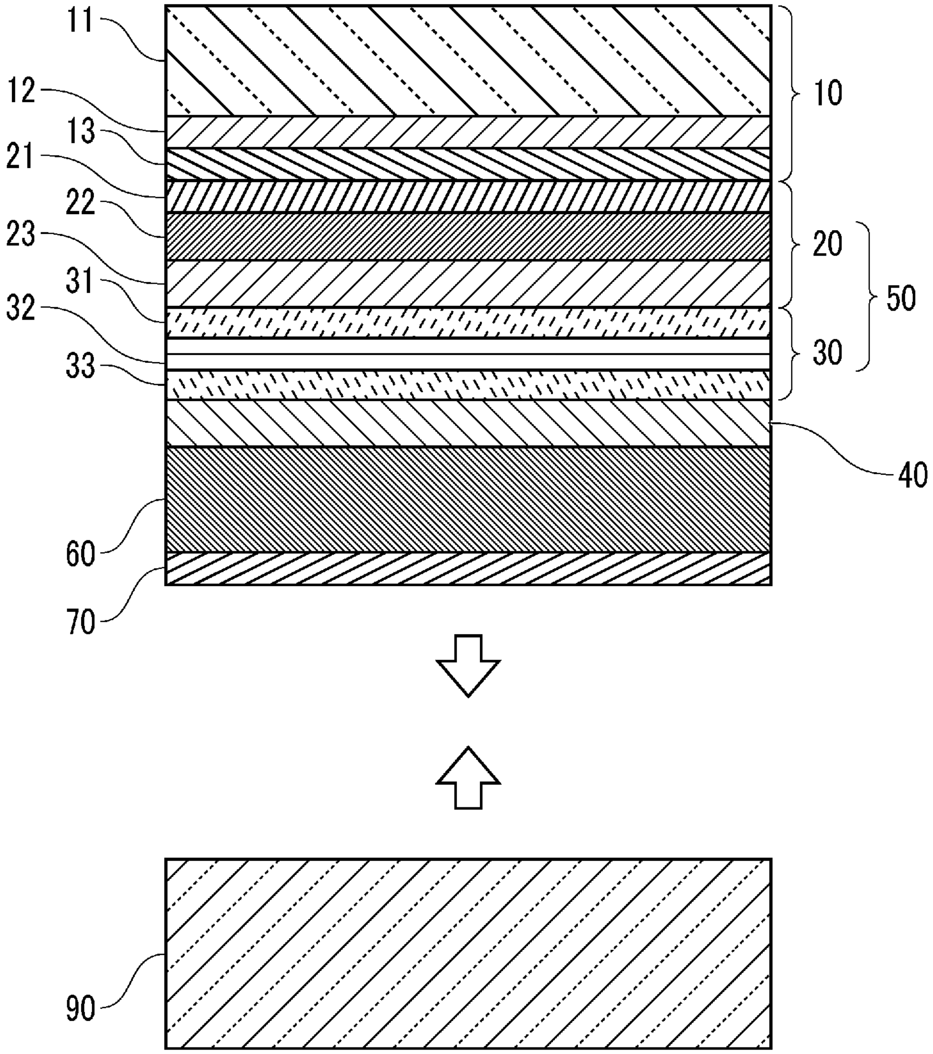
FIG. 6 is a diagram illustrating a step of bonding an element main body and a sapphire substrate in a stage before the laminated structure of FIG. 1 is manufactured.

FIG. 6 illustrates a step of bonding the element main body and the sapphire substrate 90 before one stage before the laminated structure 100 of FIG. 1 is manufactured. In the step of FIG. 6, the surface of the cap layer 70 on a light emission side as the bonding surface on the element main body side and the surface of the sapphire substrate 90 on a light incidence side are subjected to a plasma activation treatment. As a result, a dangling bond is generated on the both bonding surfaces.

After that, the both bonding surfaces are butted against each other. Then, the laminated structure 100 is heated while pressurizing from both sides in the lamination direction, and the bonding is completed. The laminated structure 100 of FIG. 1 is a laminated structure after the bonding.

Figure 7:
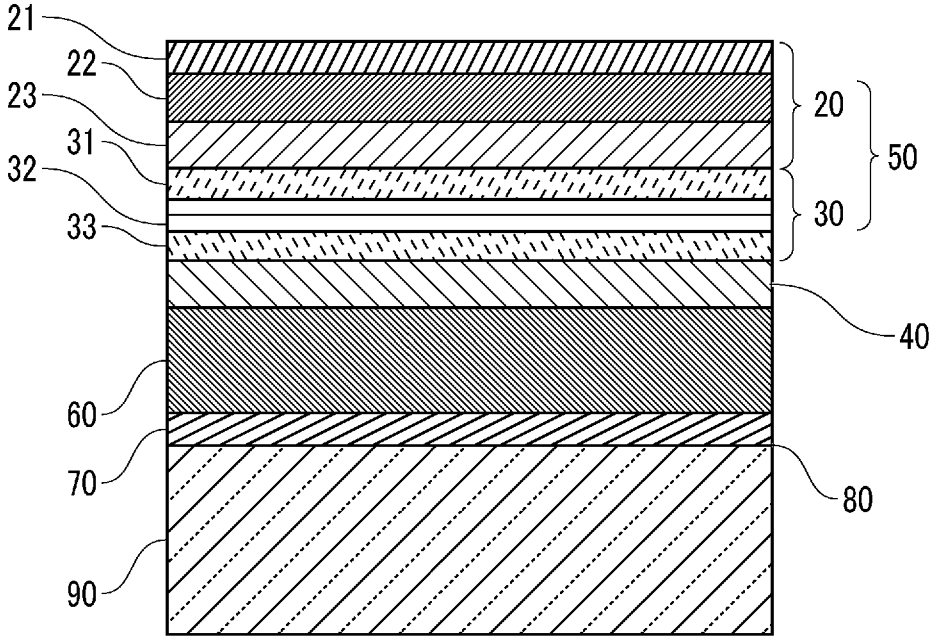
FIG. 7 illustrates a laminated structure after a GaAs substrate is removed by performing etching on the laminated structure of FIG. 1.

FIG. 7 illustrates a laminated structure after the GaAs substrate 10 is removed by performing etching on the laminated structure 100 of FIG. 1. For the etching of the GaAs substrate 10, for example, wet etching using a mixed solution including at least one of ammonia water and hydrogen peroxide water is adopted.

FIG. 8 is a manufacturing process diagram of the infrared light emitting element 110 following the step of FIG. 7. First, a first ohmic electrode 91 is formed near a half portion on one side on the upper surface of the p-type semiconductor 20 of the laminated structure of FIG. 7 (first step from the top in FIG. 8). The first ohmic electrode 91 is formed by, for example, forming an Au film by a vapor deposition method. After that, the annealing treatment is performed on the p-type semiconductor 20.

Next, half of the p-type semiconductor 20, in which the first ohmic electrode 91 is not formed, is removed by etching to the upper surface 92 of the n-type current diffusion layer 60, and the upper surface 92 is exposed (second step from the top in FIG. 8).

Next, a second ohmic electrode 93 is formed on an exposed upper surface 92 (third step from the top in FIG. 8). The second ohmic electrode 93 is also formed by, for example, forming the Au film by a vapor deposition method, as in the first ohmic electrode 91. After that, the annealing treatment is performed on the n-type current diffusion layer 60 and the n-type semiconductor layer 40.

Next, an exposed portion of the AlGaAs-based semiconductor layer 50 and the upper surface 92 are covered with a protective film 95 while the upper surfaces of the first ohmic electrode 91 and the second ohmic electrode 93 are exposed, thereby completing the infrared light emitting element 110 (first step from the bottom in FIG. 8). As the protective film 95, for example, $SiO_2$ or SiN can be selected as a main component. The protective film 95 is able to be omitted.

Although the manufacturing step of one infrared light emitting element 110 is described in FIG. 8, in reality, the substrate main body 11 is used as a substrate for manufacturing a plurality of infrared light emitting elements 110 at once, and after the plurality of infrared light emitting elements 110 are manufactured in a batch, the manufactured product in a batch is divided into the infrared light emitting elements 110 as chips by dicing.

The light emitting device as a module in which the infrared light emitting element 110 is incorporated into a package is manufactured by performing a well-known die mounting, bonding, and mold trim on the infrared light emitting element 110 of FIG. 8 in this order.

In FIG. 8, the second ohmic electrode 93 is formed on the n-type semiconductor layer 40 composed of the n-type AlGaAs clad layer. However, the second ohmic electrode 93 is able to be formed on the n-type current diffusion layer 60, and similarly to the p-type AlGaAs contact 21 of the p-type semiconductor 20, the n-type AlGaAs contact is also provided in the n-type semiconductor layer 40 and is also able to be formed on the surface thereof.

In the laminated structure 100, $SiO_2$ is not used as the bonding interface for bonding the element main body and the sapphire substrate 90. The refractive index (about 1.4) of $SiO_2$ with light having a wavelength of 940 nm is smaller than the refractive index (about 1.7) of the sapphire substrate 90. Therefore, when using $SiO_2$, the difference in refractive index between the n-type current diffusion layer 60 as the epitaxial layer on the element main body side and $SiO_2$ at the interface is larger than the difference in refractive index between the n-type current diffusion layer 60 and the amorphous layer 80 at the interface, and the total reflection component on the element main body side is increased, which leads to a decrease in a light extraction efficiency from the sapphire substrate 90 as the light transmitting plate. In the laminated structure 100, by not using $SiO_2$ as the bonding interface, such a decrease in the light extraction efficiency is able to be avoided.

Supplementary and Modification Examples

In the laminated structure 100, the thickness of the cap layer 70 is set to 90 nm, but the thickness of the cap layer 70 may be smaller than 90 nm as long as a thickness that prevents As of the AlGaAs-based semiconductor layer 50 from entering the amorphous layer 80 is secured.

The first semiconductor layer and the second semiconductor layer according to the present invention correspond to the p-type semiconductor 20 and the n-type semiconductor layer 40 of the infrared light emitting element 110, respectively. In the present invention, the first semiconductor layer and the second semiconductor layer are also able to be the n-type and the p-type, respectively.

In the infrared light emitting element 110, InGaP is used as the cap layer 70. The role of the cap layer 70 is to prevent As from being precipitated by expanding the voids in the bonding interface for bonding the element main body and the sapphire substrate 90 due to the annealing treatment. Therefore, the cap layer of the present invention may be the InGa-based semiconductor layer containing components other than P, as long as it is an InGa-based semiconductor layer that does not contain As.

Lattice constants of each substance used in the laminated structure 100 are as follows. AlGaAs: 5.6546, InGaP: 5.6596, and sapphire: 4.7588. That is, the lattice constants of the n-type current diffusion layer 60, the cap layer 70, and the sapphire substrate 90 are not strictly equal to each other, but the cap layer 70 and the sapphire substrate 90 are bonded to each other without any problem, and the amorphous layer 80 is formed therebetween.

For each substance used in the laminated structure 100, refractive indexes with respect to light having a wavelength of 940 nm are as follows. AlGaAs: 3.45, InGaP: 3.22, and sapphire: 1.76.

SYMBOL LIST

10: GaAs substrate
20: p-type semiconductor
30: active layer
40: n-type semiconductor layer
50: AlGaAs-based semiconductor layer
60: n-type current diffusion layer
70: cap layer
80: amorphous layer
90: sapphire substrate
110: infrared light emitting element (light emitting element)

What is claimed is:

1. A light emitting element comprising:

an AlGaAs-based semiconductor layer in which an active layer is disposed between a first semiconductor layer and a second semiconductor layer, and emits light from a second semiconductor layer side;

a cap layer of an InGa-based semiconductor, which is formed on a light emission side of the second semiconductor layer and does not contain As as a component;

a sapphire substrate that is disposed on a light emission side of the cap layer; and an amorphous layer that is interposed between the cap layer and the sapphire substrate, and has constituent elements of the cap layer and the sapphire substrate as components.

2. The light emitting element according to claim 1, wherein a surface orientation of the cap layer and the sapphire substrate is a c-plane (001).

3. The light emitting element according to claim 2, wherein the cap layer is InGaP.

4. The light emitting element according to claim 1, wherein the cap layer is InGaP.

5. The light emitting element according to claim 1, wherein a ratio of oxygen to aluminum is larger in the amorphous layer than in the sapphire substrate when being analyzed by TEM-EDS.

6. The light emitting element according to claim 5, wherein the amorphous layer contains P.

7. The light emitting element according to claim 5, wherein Atom-% for each element of the amorphous layer by the TEM-EDS analysis is such that In and Ga are decreased and Al is increased as proceeding from a cap layer side to a sapphire substrate side.

8. The light emitting element according to claim 1, wherein the amorphous layer contains P.

9. The light emitting element according to claim 1, wherein Atom-% for each element of the amorphous layer by TEM-EDS analysis is such that In and Ga are decreased, and Al is increased as proceeding from a cap layer side to a sapphire substrate side.

10. The light emitting element according to claim 1, wherein the cap layer has a thickness that prevents As of the AlGaAs-based semiconductor layer from entering the amorphous layer.

11. A manufacturing method of a light emitting element, comprising:

a step of forming at least a first semiconductor layer, an active layer, and a second semiconductor layer in this order on a GaAs substrate by epitaxial growth to produce an AlGaAs-based semiconductor layer;

a step of forming a cap layer of an InGa-based semiconductor, which does not contain As as a component, on a light emission side of the AlGaAs-based semiconductor layer on a second semiconductor layer side by epitaxial growth;

a step of performing a plasma activation treatment on a bonding surface of the cap layer and a sapphire substrate before the cap layer and the sapphire substrate are bonded to each other; and a step of bonding the bonding surfaces of the cap layer and the sapphire substrate to each other to form an amorphous layer having constituent elements of the cap layer and the sapphire substrate as components between the bonding surfaces.

12. The manufacturing method of a light emitting element according to claim 11, wherein the bonding of the cap layer and the sapphire substrate is performed by aligning a surface orientation of the cap layer and the sapphire substrate with a c-plane (001).

* * * * *